United States Patent
Lin et al.

[11] Patent Number: 6,136,688
[45] Date of Patent: Oct. 24, 2000

[54] HIGH STRESS OXIDE TO ELIMINATE BPSG/SIN CRACKING

[75] Inventors: Keng-Chu Lin, Ping-Tung; Kuang-Chao Chen, Chutung; Rong-Wu Chien, Hsinchu; Lian-Fa Hung, Tainan; Pang-Yen Tsai, Kaohsiung; Ching-Chang Chang, Tainan, all of Taiwan

[73] Assignee: Vanguard International Semiconductor Corporation, Hsin-Chu, Taiwan

[21] Appl. No.: 09/421,508

[22] Filed: Oct. 20, 1999

[51] Int. Cl.$^7$ .............................................. H01L 21/4763
[52] U.S. Cl. ................................................. 438/624
[58] Field of Search ................... 438/624, 633, 438/634, 699, 632, 631

[56] References Cited

U.S. PATENT DOCUMENTS

| | | | |
|---|---|---|---|
| 4,446,194 | 5/1984 | Candelaria | 428/428 |
| 4,732,801 | 3/1988 | Joshi | 428/198 |
| 5,077,238 | 12/1991 | Fujii | 437/228 |
| 5,094,984 | 3/1992 | Liu | 437/235 |
| 5,160,998 | 11/1992 | Itoh | 257/760 |
| 5,204,288 | 4/1993 | Marks | 437/228 |
| 5,275,963 | 1/1994 | Cederbaum | 437/48 |
| 5,278,103 | 1/1994 | Mallon | 437/240 |
| 5,334,552 | 8/1994 | Homma | 438/624 |
| 5,354,387 | 10/1994 | Lee et al. | 148/33.3 |
| 5,503,882 | 4/1996 | Dawson | 427/579 |
| 5,688,720 | 11/1997 | Hayashi | 437/195 |
| 5,905,298 | 5/1999 | Watatani | 257/635 |
| 6,001,710 | 12/1999 | Francois | 438/454 |

OTHER PUBLICATIONS

Wolf, Stanley, "Silicon Processing for the VLSI Era" vol. 2, p144–145 and 195, 1990.

El–Kareh, Badih, "Fundamentals of semiconductor processing technology", Kluwer Acadmic Publishers, Boston, p125–26, 1990.

Wang et al., Jpn. J. Appl. Phys. vol. 36 (1997) Pt.1, No. 9A, p5492–5497, Sep. 1997.

Lin et al., J. Electrochem. Soc., vol. 144, No. 8, p2898–2903, Aug. 1997.

Chang et al., "ULSI Technology", The McGraw–Hill Companies, Inc., New York, NY, (1996), pp. 487–488.

*Primary Examiner*—Charles Bowers
*Assistant Examiner*—E. J Kielin
*Attorney, Agent, or Firm*—George O. Saile; Stephen B. Ackerman

[57] ABSTRACT

The present invention is a method of capping with a high compressive stress oxide, a boron phospho-silicate glass (BPSG) interlayer dielectric (ILD) gapfill that has been deposited on a topographic silicon substrate, in order to eliminate the formation of cracks in subsequently deposited silicon nitride (SiN) layers, other subsequently deposited high tensile stress layers and cracks that result from other post-BPSG deposition high temperature processes.

25 Claims, 3 Drawing Sheets

HIGH STRESS OXIDE TO ELIMINATE BPSG/SIN CRACKING

BACKGROUND OF THE INVENTION

1. Field of the Invention

The present invention is a method of capping with a high compressive stress oxide, a boron phospho-silicate glass (BPSG) interlayer dielectric (ILD) gapfill that has been deposited on a topographic silicon substrate, in order to eliminate the formation of cracks in subsequently deposited silicon nitride (SiN) layers, other subsequently deposited high tensile stress layers and cracks that result from other post-BPSG deposition high temperature processes.

2. Description of the Related Art

The shrinkage of device sizes in ULSI circuit fabrications has led to the widespread use of self-alignment contacts (SAC) and multilayer structures in order to exceed the existing tolerance limits imposed by photolithography and etching processes (see C. Y. Chang and S. M. Sze, "ULSI Technology," McGraw-Hill Co., New York, 1996, pp 487–488). Said shrinkage of device sizes has also dictated the use of boron phospho-silicate glass (BPSG) as an interlayer dielectric (ILD) of choice because of its superior gapfilling of narrow spaces and for flow characteristics that lead to smooth coverings of complex topographies. The use of BPSG as both an insulating and planarizing layer is discussed by Lee et al (U.S. Pat. No. 5,354,387).

The same flow properties of BPSG which are so beneficial for gapfilling and smooth coverage, lead to problems with crack formation when high temperature post-deposition processes are carried out. In particular, subsequent depositions of LP-SiN layers, common in ULSI circuit fabrications using self-alignment contacts, show significant cracking. Cracks also appear as a result of subsequent depositions of other high tensile stress films and as a result of other high temperature processing steps, such as anneals or rapid thermal oxidation (RTO) processes. It has been recognized that BPSG layers can be protected by the application of surface films (see Hayashi, U.S. Pat. No. 5,688,720), but the use of such films has not been applied to eliminate the SiN cracking problem associated with post-deposition high temperature processing.

SUMMARY OF THE INVENTION

A first object of this invention is to provide a method for eliminating the formation of cracks in VLSI and ULSI fabrications, particularly those employing self-alignment contact (SAC) techniques, as a result of high temperature processes carried out during said fabrication subsequent to the deposition of boron phospho-silicate glass (BPSG) as an interlayer dielectric (ILD) gapfilling material on a topographic silicon substrate.

A second object of this invention is to provide a method for depositing a high compressive stress oxide layer directly on re-flowed BPSG that has been deposited as an ILD gapfill on a topographic silicon substrate.

A third object of this invention is to provide a method for depositing a layer of high tensile stress silicon nitride (LP SiN) on a re-flowed layer of BPSG that has been deposited as an ILD gapfill on a topographic silicon substrate, without the crack formation associated with such deposition when not employing the method of this invention.

A fourth object of this invention is to provide a method for high temperature processing, such as, but not limited to, SiN depositions, high tensile stress layer depositions, annealing or rapid thermal oxidation (RTO) processes, to be carried out on a VLSI or UL,SI fabrication having a topographic silicon substrate on which has been deposited a BPSG ILD gapfill, without the formation of cracks which occurs when not employing the method of this invention.

A fifth object of this invention is to provide a method for retarding the residual flow characteristics of BPSG deposited as an ILD gapfill on a topographic silicon substrate, when said substrate and deposition are subjected to post-deposition high temperature processes such as, but not restricted to, LP SiN deposition, deposition of other high tensile stress layers, annealing or RTO processes.

In accord with the objects of said invention there is provided a method for depositing a high compressive strength oxide layer, such as, but not limited to, PE-SiH$_4$ or PE TEOS, on a BPSG ILD gapfill that has been deposited on a topographic silicon substrate. Said oxide layer, when deposited prior to additional post-BPSG-deposition high temperature processes, such as, but not restricted to, SiN layer deposition, deposition of other high tensile stress layers, annealing or RTP processes, will eliminate the formation of cracks and retard the residual flow characteristics of the BPSG ILD.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 shows the placement of polysilicon and metallic topographic structures on a silicon substrate. FIG. 2 shows the results of depositing a BPSG inter-layer dielectric (ILD) gapfill over said topographic substrate, illustrating the superior gapfilling properties of BPSG for the narrow spaces of the topographic structure and the smooth surface formed by a post-deposition planarization carried out by some form of chemical-mechanical polish (CMP).

FIG. 3 shows the results of the deposition of an additional topographic structure over the re-flowed BPSG ILD gapfill layer, which may be a polysilicon topographic structure, a metallic topographic structure or a combination of said structures. FIG. 4 shows the results of a high temperature low pressure silicon nitride (LP SiN) deposition which is used as a spacer layer over said topographic structure preparatory for further processing. The cracking induced by the high temperature deposition of the SiN layer is indicated in the figure.

FIG. 5 shows the results of a deposition of a high compressive stress oxide film over the re-flowed BPSG ILD gapfill layer. FIG. 6 shows the results of the deposition of an additional topographic structure over the re-flowed BPSG ILD gapfill layer, which may be a polysilicon topographic structure, a metallic topographic structure or a combination of said structures. FIG. 9 shows the results of a high temperature low pressure silicon nitride (LP SiN) deposition which is used as a spacer layer over said topographic structure preparatory for further processing. In accordance with the methods of the present invention, the crack formation subsequent to the LP SiN deposition is absent.

DESCRIPTION OF THE PREFERRED EMBODIMENT

The present invention is method for capping with a high compressive stress oxide layer a re-flowed BPSG inter-layer dielectric gapfill deposited on a topographic silicon substrate, so that subsequent high temperature processing, such as the formation of a low pressure silicon nitride (LP SiN) layer, annealing, deposition of other high tensile stress layers or rapid thermal oxidations (RTO), will not cause the formation of cracks.

Figure 1:
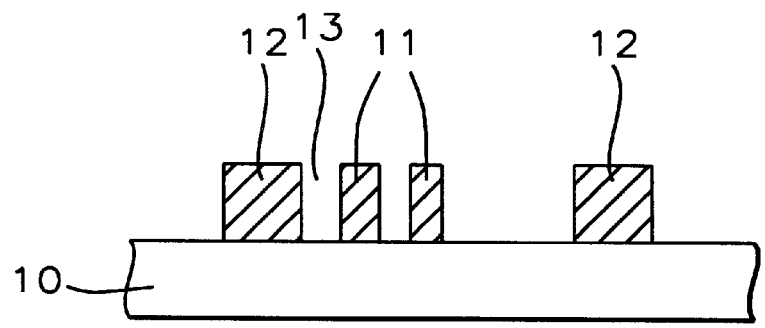
FIG. 1, FIG. 2, FIG. 3 and FIG. 4 show a series of schematic cross-sectional diagrams illustrating progressive steps in the formation of a multi-layer VLSI or ULSI microelectronics fabrication such as would occur using the technique of self aligned contacts (SAC) but without application of the methods of the present invention.

Referring now to FIG. 1, FIG. 2, FIG. 3 and FIG. 4, there is shown a series of schematic cross-sectional diagrams illustrating the results of forming two successive topographic layers, such as might occur in a ULSI fabrication using the method of self-aligned contacts (SAC) and not using the methods of the present invention. FIG. 1 shows a silicon substrate (10), over which has been fabricated a topology consisting of polysilicon structures (12) and metal structures (11) separated by narrow spaces (13). A typical such fabrication is composed of structures whose heights are between 3000 angstroms and 5000 angstroms, whose widths are between 1500 angstroms and 3000 angstroms and which are separated by spaces of between 1500 angstroms and 3000 angstroms.

Figure 2:
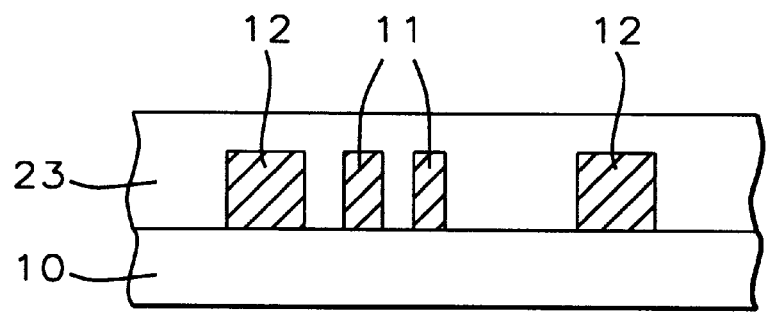

FIG. 2 shows the topographic substrate of FIG. 1, over which a BPSG dielectric gapfill layer (23) has been deposited, re-flowed and smoothed by CMP to a thickness of between 4000 angstroms and 8000 angstroms.

Figure 3:
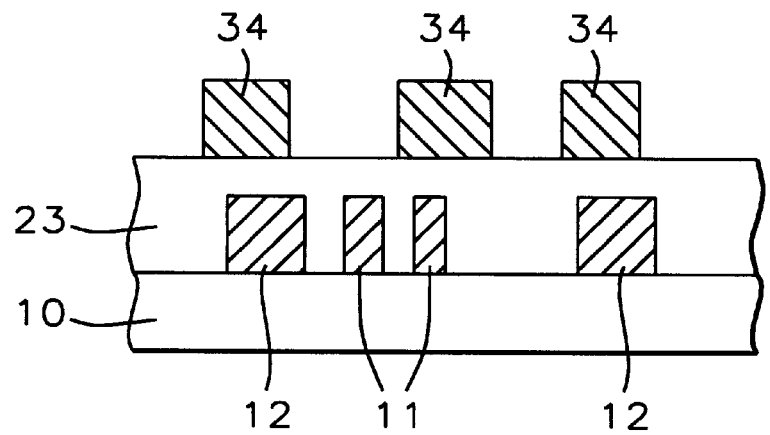
Figure 4:
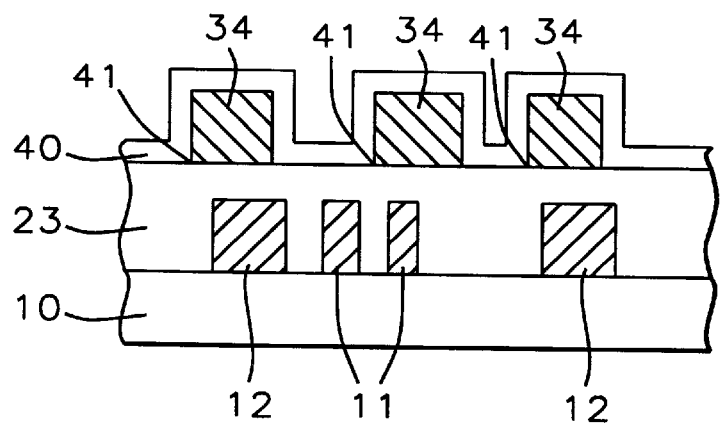

The diagram depicts the excellent gapfill and smooth re-flow qualities of BPSG for complex topographies and small dimensions. FIG. 3 shows the deposition of a series of structures, which are depicted here as similar polysilicon layers (34), but which may be metal layers or combinations of the two, deposited in a topographic pattern directly on the BPSG surface in a method that is not in accord with the present invention. Such structures can have heights of between 2000 angstroms and 4000 angstroms, widths between 1000 angstroms and 4000 angstroms and can be separated by spaces of dimensions between 1500 angstroms and 3000 angstroms. FIG. 4 depicts the topographic structures of FIG. 3 over which has been deposited a protective layer of silicon nitride (40), denoted simply as (SiN), of thickness between 30 angstroms and 100 angstroms, by a method of low pressure chemical vapor deposition (LP CVD). As a result of the SiN deposition, cracks form (41) at the junctions of the polysilicate structures and the BPSG surface.

Figure 5:
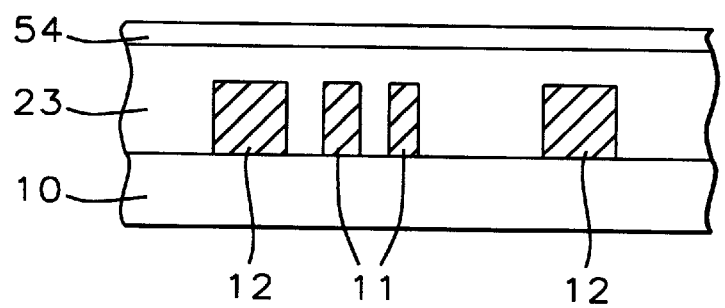
FIG. 5, FIG. 6 and FIG. 7 show a series of schematic cross-sectional diagrams illustrating the progressive steps that would follow the steps already described in FIG. 1 and FIG. 2, in the formation of a multi-layer VLSI or ULSI microelectronics fabrication such as would occur using the technique of self aligned contacts (SAC) according to the methods of the present invention.
Figure 6:
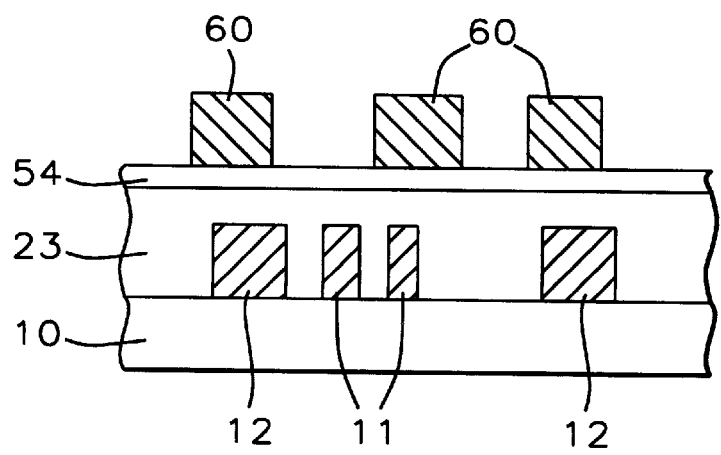
Figure 7:
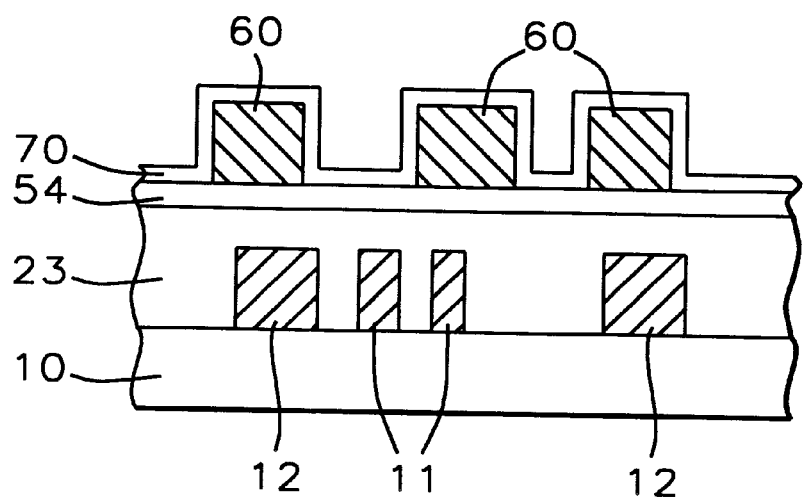

FIG. 5, FIG. 6 and FIG. 7 provide a series of illustrations of processes carried out in accordance with the method of the present invention. FIG. 5 shows the deposition of a high compressive stress oxide layer (54) deposited directly on the surface of the reflowed BSPG ILD gapfill (23). Said layer, which is deposited by plasma enhanced chemical vapor deposition (PE CVD) can be, but is not limited to, plasma enhanced silane, PE-SiH$_4$ or plasma enhanced tetraethyl orthosilicate, PE TEOS and can be deposited to a thickness in the range between 500 angstroms and 2000 angstroms.

Said deposition occurs at a temperature between approximately 300° C. and 500° C. using a power level of between approximately 300 W and 2000 W, a pressure of between approximately 0.1 torr and 20 torr and a flow rate of between approximately 10 and 1000. The physical role of said layer is to counter the thermally induced tensile stress in the BPSG layer with its own compressive stress and to thereby provide a stable substrate for the subsequent thermal deposition of the SiN layer. Experiment has shown that a compressive stress greater than $-3.0E9$ dyne/cm$^2$ in the PE SiH$_4$ or PE TEOS layer is required to prevent cracks from forming in the SiN layer. FIG. 6 shows the equivalent polysilicon structures (60) as were depicted in FIG. 3, now deposited on the high compressive strength layer (54). FIG. 7 shows the SiN layer (70) deposited over said polysilicon structures (71) and high compressive strength layer (54). The absence of cracks is indicated in the illustration.

As is understood by a person skilled in the art, the preferred embodiment and examples of the present invention are illustrative of the present invention rather than limiting of it. Revisions and modifications may be made to processes, structures and dimensions through which is formed a high stress oxide to eliminate BPSG/SiN cracking in accord with the preferred embodiment and examples of the present invention while still providing such a high stress oxide to eliminate BPSG/SiN cracking in accord with the present invention and appended claims.

What is claimed is:

1. A method for capping a gapfill layer with a high compressive stress oxide so as to eliminate cracking in a subsequently deposited LP-SiN spacer/capping layer that would be caused by further high temperature process steps, comprising:

providing a topographic substrate on which has been deposited and reflowed an interlayer dielectric (ILD) gapfill;

depositing on said interlayer dielectric (ILD) gapfill a high compressive stress oxide;

fabricating on said high compressive stress oxide a topography which may consist of a conductive layer, an insulating layer, a doped glass layer, a semiconducting layer or a combination thereof and depositing on said topography an LP-SiN spacer/capping layer.

2. The method of claim 1 wherein said ILD is a reflowed layer of boron phospho-silicate glass (BPSG) deposited, reflowed and smoothed to a thickness of between approximately 4000 angstroms and 8000 angstroms.

3. The method of claim 1 wherein said high compressive strength oxide layer is a plasma enhanced chemical vapor deposition (PE CVD) of tetraethyl orthosilicate (TEOS), deposited to a thickness of between approximately 500 angstroms and 2000 angstroms.

4. The method of claim 1 wherein said high compressive strength oxide layer deposited on the interlayer dielectric (ILD) gapfill is a plasma enhanced chemical vapor deposition (PE CVD) of tetraethyl orthosilicate (TEOS), deposited to produce a measured compressive stress that exceeds $-3.0E9$ dynes/cm$^2$.

5. The method of claim 1 wherein said high compressive strength oxide layer deposited on the interlayer dielectric (ILD) gapfill is a plasma enhanced chemical vapor deposition (PE CVD) of silane (SiH$_4$), deposited to a thickness of between approximately 1000 A and 1500 A.

6. The method of claim 1 wherein said high compressive strength oxide layer deposited on the interlayer dielectric (ILD) gapfill is a plasma enhanced chemical vapor deposition (PE CVD) of silane ($SiH_4$), deposited to produce a measured compressive stress that exceeds −3.0E9 dynes/$cm^2$.

7. The method of claim 1 wherein the topography fabricated on said high compressive strength oxide layer is a topography consisting of metallic structures, polysilicon structures or combinations thereof, of widths between approximately 1000 angstroms and 4000 angstroms, of heights between approximately 2000 angstroms and 4000 angstroms and of spacings between approximately 1500 angstroms and 3000 angstroms.

8. The method of claim 1 wherein the spacer layer formed on said topography is a low pressure silicon nitride (LP-SiN) layer deposited to a thickness of between 30 angstroms and 100 angstroms.

9. The method of claim 1 where the high temperature process applied subsequent to the deposition of said high compressive strength oxide is a high temperature annealing process.

10. The method of claim 1 where the high temperature process applied subsequent to the deposition of said high compressive strength oxide is a rapid thermal oxidation (RTO) process.

11. The method of claim 1 where the high temperature process applied subsequent to the deposition of said high compressive strength oxide is the deposition of a high tensile stress layer.

12. A method for stabilizing the thermal stress and reflow characteristics of an interlayer dielectric (ILD) gapfill so as to prevent cracking in a subsequently deposited LP-SiN spacer/capping layer that would be caused by further high temperature process steps, comprising:

providing a topographic substrate on which has been deposited and reflowed an interlayer dielectric (ILD) gapfill and depositing on said interlayer dielectric (ILD) gapfill a high compressive stress oxide;

fabricating on said high compressive stress oxide a topography which may consist of a conductive layer, an insulating layer a doped glass layer a semiconducting layer or a combination thereof and depositing on said topography an LP-SiN spacer/capping layer.

13. The method of claim 12 wherein said ILD is a reflowed layer of boron phospho-silicate glass (BPSG) deposited, reflowed and smoothed to a thickness of between approximately 4000 angstroms and 8000 angstroms.

14. The method of claim 12 wherein said high compressive strength oxide layer is a plasma enhanced chemical vapor deposition (PE CVD) of tetraethyl orthosilicate (TEOS), deposited to a thickness of between approximately 500 angstroms and 2000 angstroms.

15. The method of claim 12 wherein said high compressive strength oxide layer deposited on the interlayer dielectric (ILD) gapfill is a plasma enhanced chemical vapor deposition (PE CVD) of tetraethyl orthosilicate (TEOS), deposited to produce a measured compressive stress that exceeds −3.0E9 dynes/$cm^2$.

16. The method of claim 12 wherein said high compressive strength oxide layer deposited on the interlayer dielectric (ILD) gapfill is a plasma enhanced chemical vapor deposition (PE CVD) of silane ($SiH_4$), deposited to a thickness of between approximately 500 angstroms and 2000 angstroms.

17. The method of claim 12 wherein said high compressive strength oxide layer deposited on the interlayer dielectric (ILD) gapfill is a plasma enhanced chemical vapor deposition (PE CVD) of silane ($SiH_4$), deposited to produce a measured compressive stress that exceeds −3.0E9 dynes/$cm^2$.

18. A method for stabilizing the residual flow characteristics of an interlayer dielectric (ILD) gapfill comprising:

providing a topographic substrate on which has been deposited and reflowed an interlayer dielectric (ILD) gapfill and depositing on said interlayer dielectric (ILD) gapfill a high compressive stress oxide.

19. The method of claim 18 wherein said ILD is a reflowed layer of boron phospho-silicate glass (BPSG) deposited, reflowed and smoothed to a thickness of between approximately 4000 angstroms and 8000 angstroms.

20. The method of claim 18 wherein said high compressive stress oxide layer is a plasma enhanced chemical vapor deposition (PE CVD) of tetraethyl orthosilicate (TEOS), deposited to a thickness of between approximately 500 angstroms and 2000 angstroms.

21. The method of claim 18 wherein said high compressive strength oxide layer deposited on the interlayer dielectric (ILD) gapfill is a plasma enhanced chemical vapor deposition (PE CVD) of tetraethyl orthosilicate (TEOS), deposited to produce a measured compressive stress that exceeds −3.0E9 dynes/$cm^2$.

22. The method of claim 18 wherein said high compressive strength oxide layer deposited on the interlayer dielectric (ILD) gapfill is a plasma enhanced chemical vapor deposition (PE CVD) of silane ($SiH_4$), deposited to a thickness of between approximately 500 angstroms and 2000angstroms.

23. The method of claim 18 wherein said high compressive strength oxide layer deposited on the interlayer dielectric (ILD) gapfill is a plasma enhanced chemical vapor deposition (PE CVD) of silane ($SiH_4$), deposited to produce a measured compressive stress that exceeds −3.0E9 dynes/$cm^2$.

24. A multi-level, inter-layer dielectric (ILD) gapfill structure capped with a high compressive stress oxide, comprising:

a semiconductor substrate over which exists a topography;

a dielectric gapfilling layer formed over said topography;

a high compressive stress oxide formed over said dielectric gapfilling layer;

a topography formed over said high compressive stress oxide;

an LP-SiN spacer/capping layer formed over said topography.

25. The structure of claim 24 wherein the structure forms a part of a self-alignment contact (SAC) structure.

* * * * *